(12) United States Patent
Zhang et al.

(10) Patent No.: US 9,230,949 B2
(45) Date of Patent: Jan. 5, 2016

(54) METHOD OF MAKING STACKED MULTI-CHIP PACKAGING STRUCTURE

(71) Applicant: Alpha and Omega Semiconductor Incorporated, Sunnyvale, CA (US)

(72) Inventors: Xiaotian Zhang, San Jose, CA (US); Hua Pan, Shanghai (CN); Ming-Chen Lu, Shanghai (CN); Jun Lu, San Jose, CA (US); Hamza Yilmaz, Saratoga, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/641,351

(22) Filed: Mar. 7, 2015

(65) Prior Publication Data
US 2015/0179626 A1   Jun. 25, 2015

Related U.S. Application Data

(62) Division of application No. 13/955,206, filed on Jul. 31, 2013, now Pat. No. 9,006,870.

(51) Int. Cl.
*H01L 25/00* (2006.01)
*H01L 23/00* (2006.01)
(Continued)

(52) U.S. Cl.
CPC .............. *H01L 25/50* (2013.01); *H01L 21/304* (2013.01); *H01L 21/56* (2013.01); *H01L 21/78* (2013.01); *H01L 22/14* (2013.01); *H01L 23/3675* (2013.01); *H01L 23/492* (2013.01); *H01L 23/49503* (2013.01); *H01L 23/49524* (2013.01); *H01L 23/49534* (2013.01); *H01L 23/49562* (2013.01); *H01L 23/49575* (2013.01); *H01L 24/11* (2013.01); *H01L 24/27* (2013.01); *H01L 24/33* (2013.01); *H01L 24/37* (2013.01); *H01L 24/40* (2013.01); *H01L 24/49* (2013.01); *H01L 24/81* (2013.01); *H01L 24/83* (2013.01); *H01L 24/85* (2013.01); *H01L 24/97* (2013.01); *H01L 25/0652* (2013.01); *H01L 25/07* (2013.01); *H01L 23/4334* (2013.01); *H01L 24/05* (2013.01); *H01L 24/06* (2013.01); *H01L 24/48* (2013.01); *H01L 2224/05553* (2013.01); *H01L 2224/05554* (2013.01); *H01L 2224/0603* (2013.01); *H01L 2224/118* (2013.01);
(Continued)

(58) Field of Classification Search
CPC ........................................ H01L 24/35
See application file for complete search history.

(56) References Cited

U.S. PATENT DOCUMENTS

2008/0197463 A1* 8/2008 Otremba ............ H01L 23/49524
257/676
2010/0133670 A1* 6/2010 Liu .................... H01L 23/49524
257/675

(Continued)

*Primary Examiner* — Ha Tran T Nguyen
*Assistant Examiner* — Jordan Klein
(74) *Attorney, Agent, or Firm* — Chein-Hwa S. Tsao; Chen-Chi Lin

(57) ABSTRACT

A stacked multi-chip packaging structure comprises a lead frame, a first semiconductor chip mounted on the lead frame, a second semiconductor chip flipped-chip mounted on the lead frame, a metal clip mounted on top of the first and second semiconductor chips and a third semiconductor chip stacked on the metal clip; bonding wires electrically connecting electrodes on the third semiconductor chip to the first and second semiconductor chips and the pins of the lead frame; plastic molding encapsulating the lead frame, the chips and the metal clip.

9 Claims, 19 Drawing Sheets

(51) Int. Cl.
*H01L 23/495* (2006.01)
*H01L 25/07* (2006.01)
*H01L 23/492* (2006.01)
*H01L 21/304* (2006.01)
*H01L 21/56* (2006.01)
*H01L 21/78* (2006.01)
*H01L 21/66* (2006.01)
*H01L 23/367* (2006.01)
*H01L 25/065* (2006.01)
*H01L 23/433* (2006.01)

(52) U.S. Cl.
CPC ............... *H01L 2224/13022* (2013.01); *H01L 2224/32245* (2013.01); *H01L 2224/37013* (2013.01); *H01L 2224/40137* (2013.01); *H01L 2224/40145* (2013.01); *H01L 2224/40247* (2013.01); *H01L 2224/48091* (2013.01); *H01L 2224/48106* (2013.01); *H01L 2224/48145* (2013.01); *H01L 2224/48177* (2013.01); *H01L 2224/48247* (2013.01); *H01L 2224/48465* (2013.01); *H01L 2224/49111* (2013.01); *H01L 2224/49113* (2013.01); *H01L 2224/49171* (2013.01); *H01L 2224/73263* (2013.01); *H01L 2224/73265* (2013.01); *H01L 2224/8385* (2013.01); *H01L 2224/83851* (2013.01); *H01L 2225/0651* (2013.01); *H01L 2225/06506* (2013.01); *H01L 2225/06572* (2013.01); *H01L 2225/06589* (2013.01); *H01L 2924/00014* (2013.01); *H01L 2924/0781* (2013.01); *H01L 2924/07802* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 2011/0309454 A1* | 12/2011 | Ho | H01L 23/49524 257/392 |
| 2012/0326287 A1* | 12/2012 | Joshi | H01L 23/49524 257/676 |
| 2014/0284777 A1* | 9/2014 | Otremba | H01L 23/49513 257/666 |

* cited by examiner

METHOD OF MAKING STACKED MULTI-CHIP PACKAGING STRUCTURE

CROSS REFERENCE TO RELATED APPLICATIONS

This application is a divisional application of a pending US patent application entitled "STACKED MULTI-CHIP PACKAGING STRUCTURE AND MANUFACTURING METHOD THEREOF" by Xiaotian Zhang et al with application Ser. No. 13/955,206, and filing date of Jul. 31, 2013 whose content is hereby incorporated by reference for all purposes.

FIELD OF THE INVENTION

The present invention relates to the semiconductor device, and in particular, to a stacked multi-layer packaging structure and a manufacturing method thereof.

DESCRIPTION OF THE RELATED ART

Generally, a DC-DC converter includes two MOSFETs (Metal-Oxide-Semiconductor Field Effect Transistor), one of which is a high-side MOSFET (hereinafter referred to as HS MOSFET) and the other is a low-side MOSFET (hereinafter referred to as LS MOSFET). The gate electrode G1 of the HS MOSFET and the gate electrode G2 of the LS MOSFET are connected with an IC controller and the drain electrode D1 of the HS MOSFET is connected with a Vin end, the source electrode S1 is connected with the drain electrode D2 of the LS MOSFET, while the source electrode S2 of the LS MOSFET is connected with a Gnd end.

However, in a DC-DC converter, a high-side MOSFET chip and a low-side MOSFET chip and an IC controller chip are arranged side by side on the same plane surface of a lead frame and are co-packaged inside a plastic package body, which requires a larger package size and results in higher electrical and thermal resistance due to wire bonding, thus the device electrical efficiency is lower.

It is within this context that embodiments of the present invention arise.

BRIEF DESCRIPTIONS OF THE DRAWINGS

DETAILED DESCRIPTIONS OF THE PREFERRED EMBODIMENTS

As shown in attached drawings, the embodiments of the invention are more sufficiently described. However, the attached drawings are only used for explaining and illustrating rather than limiting the scope of the invention.

Embodiment 1

Figure 1A:
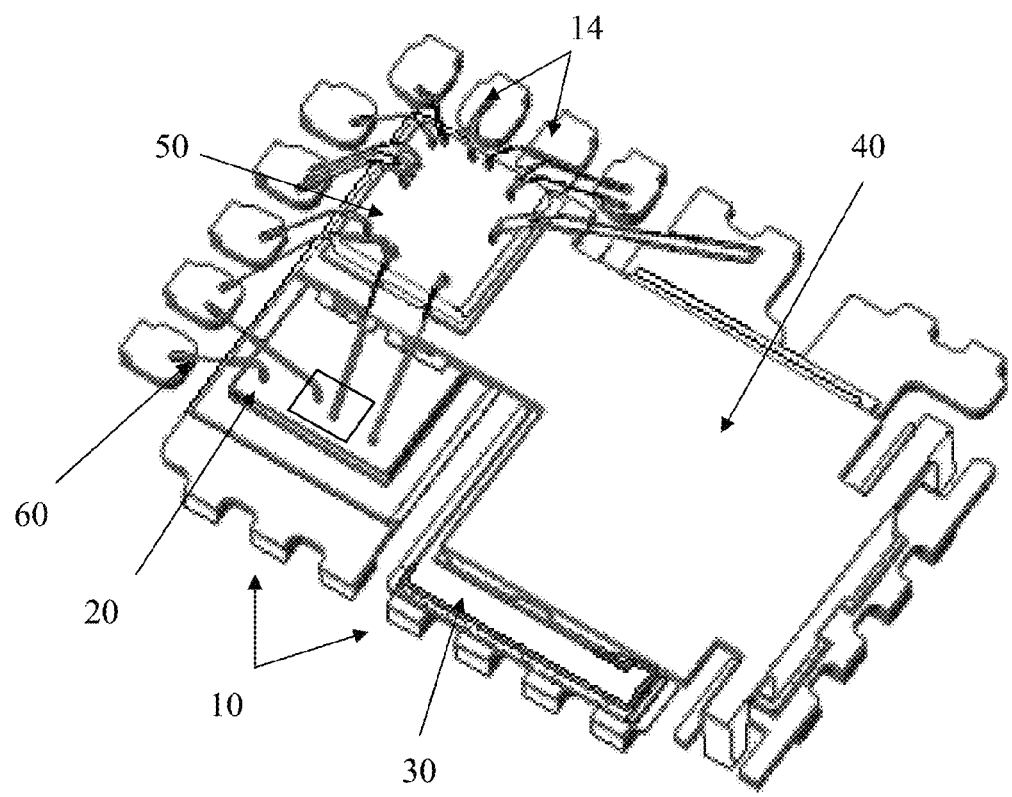
FIG. 1A illustrates a perspective view of a chip packaging structure according to a first embodiment of the present invention.
Figure 1B:
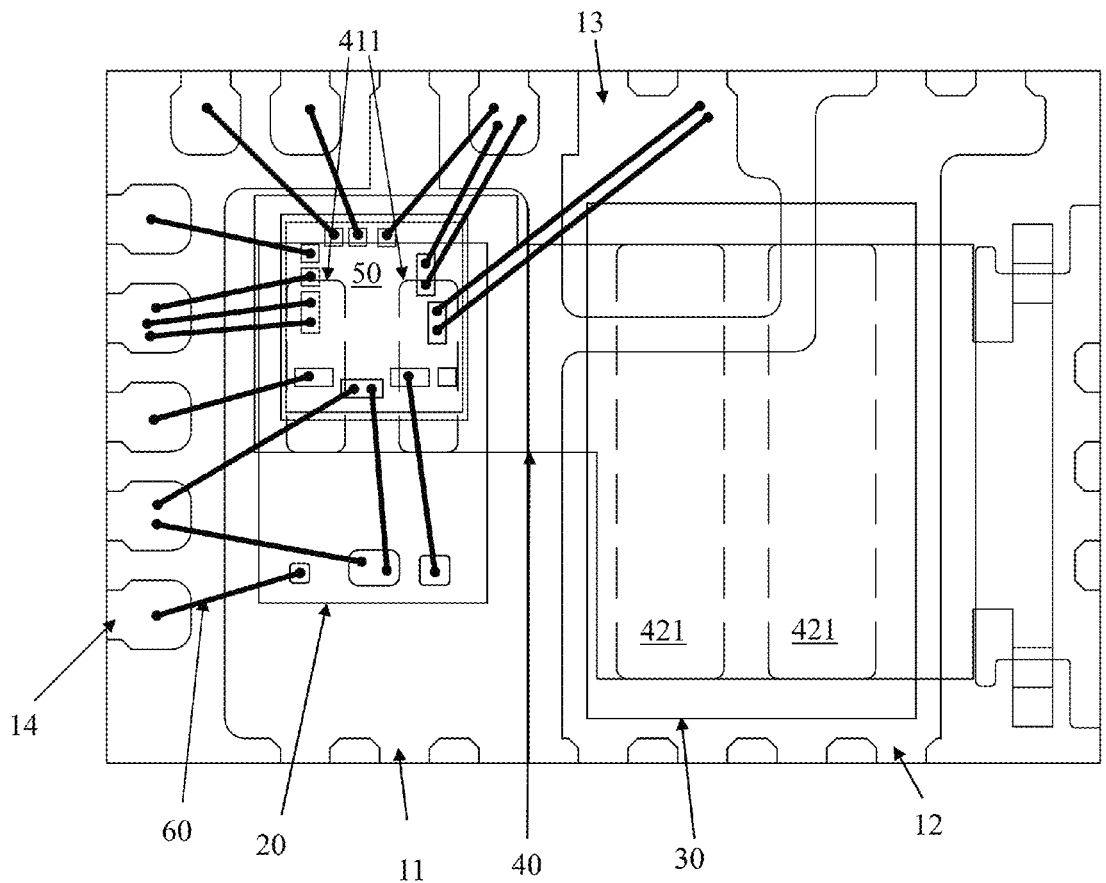
FIG. 1B illustrates a top view of a chip packaging structure according to a first embodiment of the present invention.
Figure 1C:
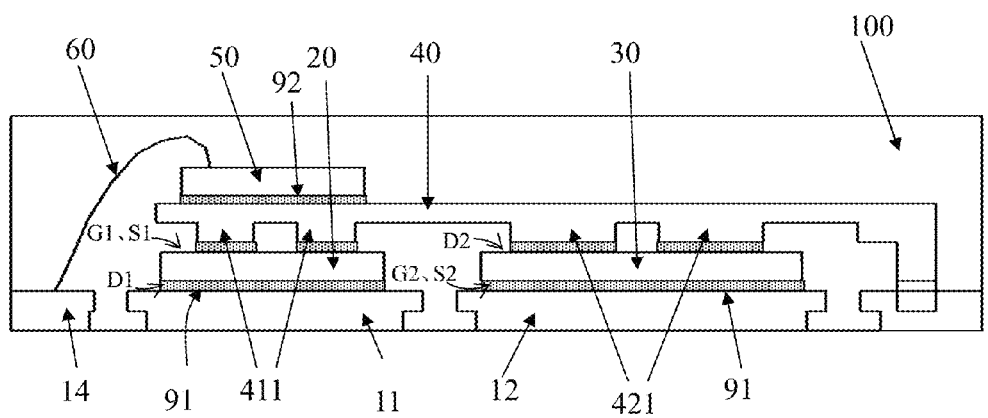
FIG. 1C illustrates a cross-sectional diagram of a chip packaging structure according to a first embodiment of the present invention.

As shown in FIG. 1A-FIG. 1C, according to the present invention, HS MOSFET 20 and LS MOSFET 30 of same type (N-type or P-type) are attached on two separate paddles 11 and 12 of a lead frame 10. An IC controller 50 is stacked on the two MOSFETs 20 and 30 through a metal clip 40, and is electrically connected with the corresponding electrodes of the LS MOSFET 30 and the HS MOSFET 20 and a pin 14 of the lead frame 10 through bonding wires 60. The HS MOSFET 20, LS MOSFET 30, and the IC controller 50 are then packaged inside a plastic package body 100 forming a DC-DC converter.

Each of the HS chip 20 and LS chip 30 includes a source electrode and a gate electrode at the front surface and a drain electrode at the back surface. Both of the gate electrodes G1 and G2 of the HS chip 20 and LS chip 30 are connected to a control electrode on the IC chip 50, the drain electrode D1 of the HS chip 20 is connected to a Vin end, the source electrode S1 is connected to the drain electrode D2 of the LS chip 30, while the source electrode S2 of the LS chip 30 is connected to the Gnd end to form the DC-DC converter. Further, a capacitor, an inductor and other components may be arranged between the Vin end and the Gnd ends of the DC-DC converter.

Figure 2A:
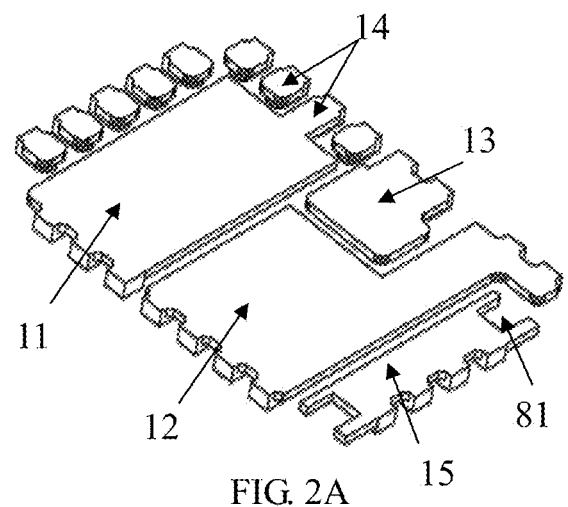
FIG. 2A-FIG. 2G are structural schematic diagrams illustrating corresponding steps of a chip packaging method according to the first embodiment of the present invention.

As shown in FIG. 2A, a lead frame 10 includes a first die paddle 11 and a second die paddle separated from each other and arranged side-by-side, where the second die paddle include a first part 12 and a second part 13 separated from each other. The lead frame 10 further includes a plurality of pins 14, which are separated from each other and separated from the first die paddle 11 and the second die paddle, including a low-side source pin, a low-side gate pin, a high-side source pin, a high-side gate pin, and an interconnection pin 15.

According to an embodiment, pins 14 are distributed around and separated from the first die paddle 11 and the second die paddle, where the high-side drain pin extends from the first die paddle 11, the low-side source pin extends from the first part 12 of the second die paddle, the low-side gate pin extends from the second part 13 of the second die paddle.

Figure 2B:
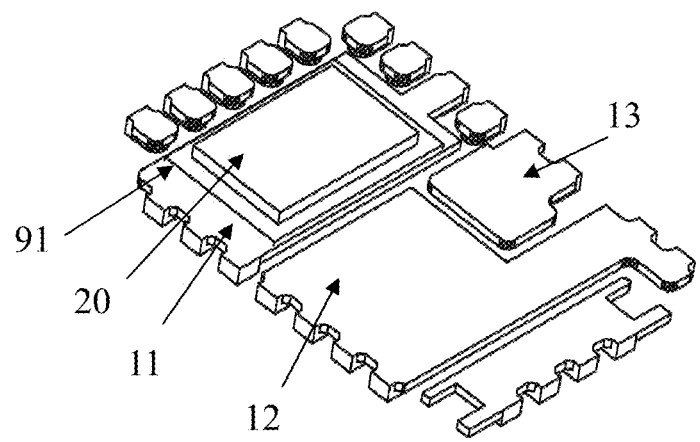

As shown in FIG. 2B, the HS chip 20 is attached on the first die paddle 11 via a soldering or conductive adhesive 91 or other conductive connecting materials arranged between the back surface of the HS chip 20 and the top surface of the first die paddle 11, so that the drain electrode D1 at the back surface of the HS chip 20 is electrically connected with the first die paddle 11 and is connected with an external device through the high-side drain pin.

Figure 2C:
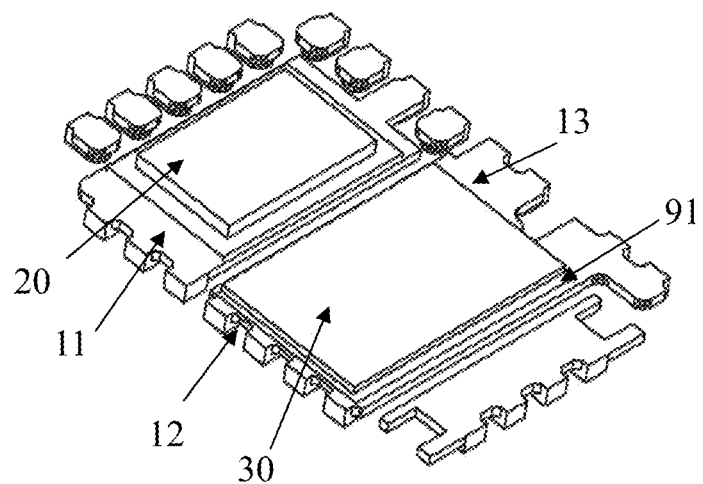

As shown in FIG. 2C, the LS chip 30, at chip scale package level, is flipped and attached on the second die paddle via a soldering or conductive adhesive 91 and the like arranged between the front surface of the LS chip 30, the first part 12 and the second part 13 of the second die paddle, so that the source electrode S2 at the front surface of the LS chip 30 is electrically connected with the first part 12 of the second die paddle and is connected with the external device through the low-side source pin. In addition, the gate electrode G2 at the front surface of the LS chip 30 is electrically connected with the second part 13 of the second die paddle and is connected with the external device through the low-side gate pin.

Figure 2D:
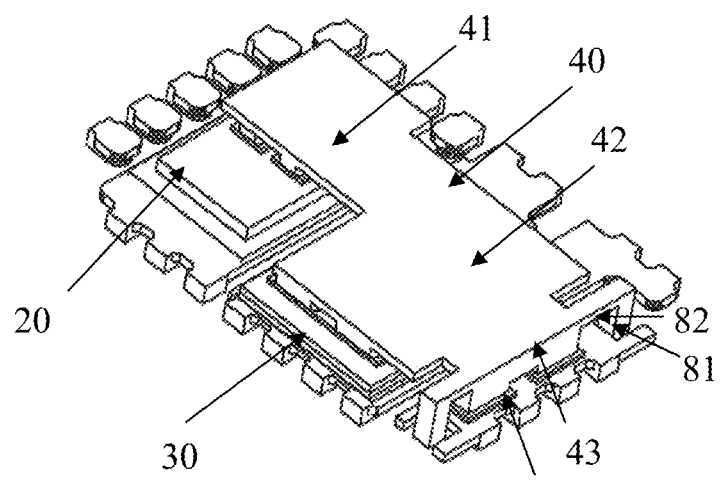

As shown in FIG. 2D, a metal clip 40, for example a copper clip, includes a high-side connecting part 41 and a low-side connecting part 42, which are attached on the front surface of the HS chip 20 and the back surface of the flipped LS chip 30 through a soldering or conductive adhesive 91 and the like, so that the source electrode S1 at the front surface of the HS chip 20 and the drain electrode D2 at the back surface of the LS chip 30 are electrically connected together through the metal clip 40.

The thickness of the metal clip 40 is designed to meet a condition that is the sum of the thickness of the high-side connecting part 41 of the metal clip 40 and the thickness of the HS chip 20 attached underneath is equal to the sum of the thickness of the low-side connecting part 42 of the metal clip 40 and the thickness of the LS chip 30 attached underneath, so as to ensure the top surface of the whole metal clip 40 is completely flat and parallel to the plane of the HS chip 20 and the LS chip 30 after bonding, so that the IC chip 50 is stably attached on the metal clip 40 in the subsequent step. For example, according to a preferred embodiment, the first die paddle 11 has the same thickness as that of the second die paddle and the HS chip 20 has the same thickness as that of the LS chip 30, as such the top surfaces of the two chips are co-planar after attached on the lead frame 10. In addition, the thicknesses of the portions on the metal clip 40 correspondingly connecting with the HS chip 20 and the LS chip 30 are designed to ensure that the top surface of the metal clip after stacked on the two chips is completely flat.

Figure 1D:
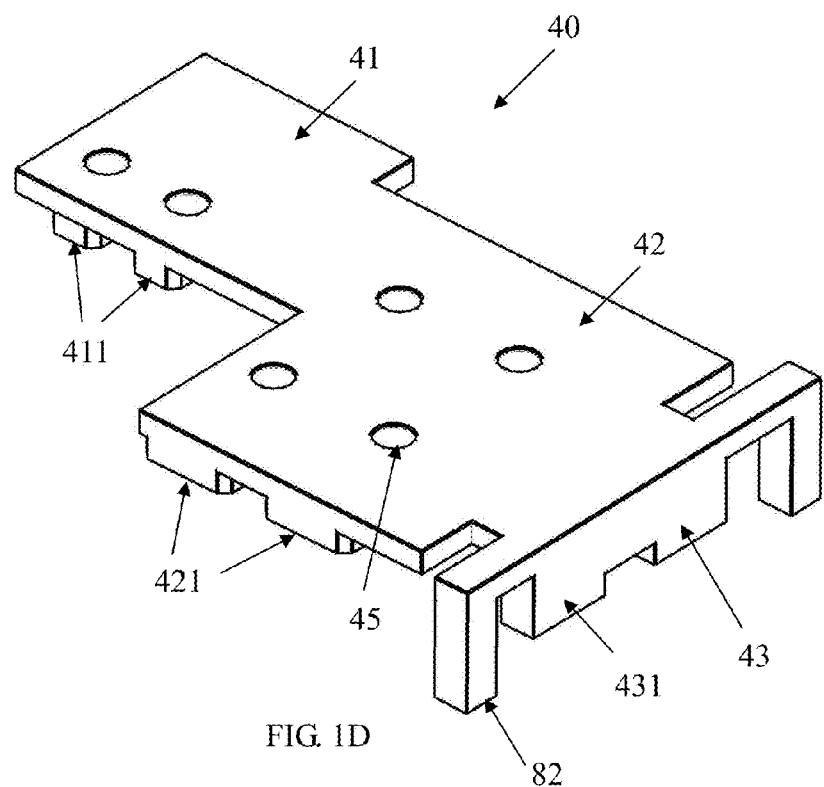
FIG. 1D and FIG. 1E are structural schematic diagrams illustrating the top view and bottom view of a preferred metal clip used in the chip packaging structure disclosed in the present invention.
Figure 1E:
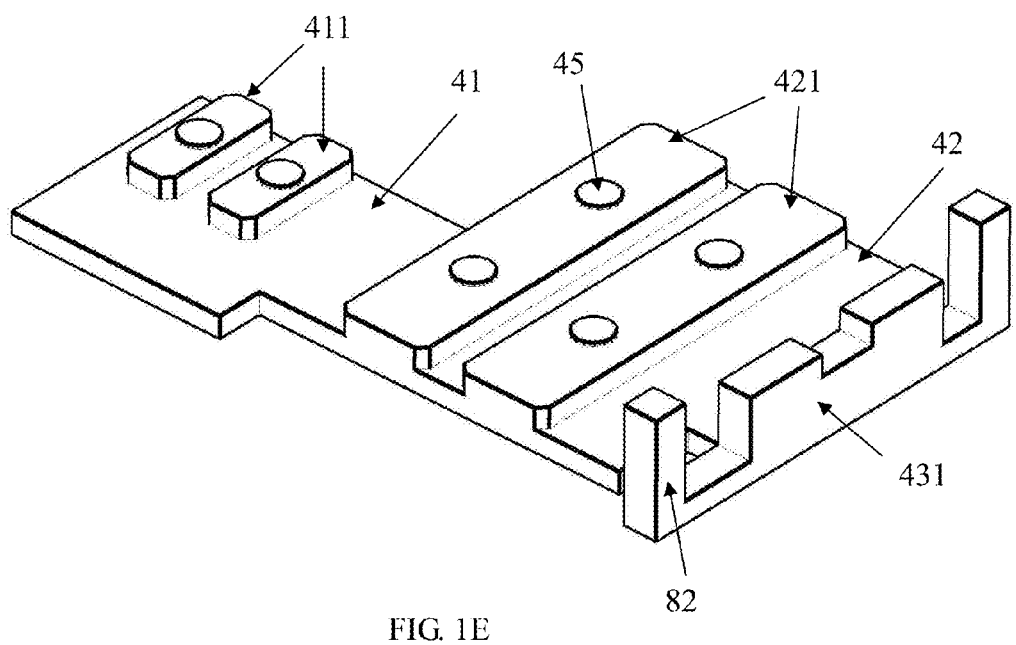

FIG. 1D and FIG. 1E are top and bottom views of the metal clip 40. As shown in these figures, the thickness of the high-side connecting part 41 and the low-side connecting part 42 can be adjusted by forming the blocks 411 and 421 at the bottom of the metal clip 40 respectively. In addition, according to the preferred embodiment, a sum of the thicknesses of the metal clip 40 and the first semiconductor chip 20 and a sum of the thickness of the metal clip 40 and the second semiconductor chip 30 (or the thickness of the soldering or conductive adhesive 91 for die attach between the first semiconductor chip 20 and the second semiconductor chip 30 and the metal clip 40) are defined by a plurality of dimples 45 formed in the metal clip 40, which further prevents the metal clip 40 from tilting after attached on the first semiconductor chip 20 and the second semiconductor chip 30. These dimples 45 are formed by a stamping process to punch on selected part from the top surface of the metal clip 40 and can be made in the array. The depth of different dimples 45 can be the same or different, which depends on the requirement of the thickness of the metal clip 40.

In addition, the metal clip 40 further includes a pin connecting part 43 for electrically connecting with the interconnecting pin 15 of the lead frame 10, so that the source electrode S1 of the HS chip 20, the drain electrode D2 of the LS chip 30 and the metal clip 40 may be further connected with the external device through the interconnecting pin 15. The sum of the thickness of the pin connecting part 43 of the metal clip 40 and the thickness of the interconnecting pin 15 connected is also designed so that the top surface of the connection plate 40 is parallel to that of the two MOSFET chips 20 and 30 after bonding.

According to the preferred embodiment, the interconnecting pin 15 of the lead frame 10 and the pin connecting part 43 of the metal clip 40 further include locking features. In the example structure shown in FIG. 2A, the interconnecting pin 15 includes locking holes 81, and the pin connecting part 43 of the metal clip 40 includes locking pieces 82 at the corresponding position at the bottom extending and bending downward from the bottom surface of the metal clip 40, which is able to correspondingly insert into the locking holes 81 to lock the metal clip 40 with the lead frame, thus minimizing the metal clip 40 from shifting or rotating. In addition, the locking piece 82 on the metal clip 40 is thicker than the part 431 of the pin connecting part 43 to ensure the locking piece 82 able to correspondingly insert into the locking hole 81 of the interconnecting pin 15. The present invention does not limit the position of the locking hole 81 and the locking piece 82 or other types of the locking features of the interconnecting pin 15 of the lead frame 10 and the pin connecting part 43 of the metal clip 40.

In the example structure shown in FIG. 2D, the low-side connecting part 42 of the metal clip 40 basically covers the whole top surface of the LS chip 30; however, the high-side connecting part 41 only covers a portion of the top surface of the HS chip 20. Therefore, the source electrode S1 and the gate electrode G1 at the front surface of the HS chip 20 not being covered by the metal clip 40 can be electrically connected to the pin 14 of the lead frame 10 or to the other chips (for example IC chip 50) through a plurality of bonding wires 60 respectively. The present invention does not limit to the use of the other structures of the metal clip 40, for example the low-side connecting part 42 of the metal clip 40 only cover a portion of the top surface of the LS chip 30 or the metal clip 40 is not whole piece, but includes separate connecting parts that mutually connected or assembled together.

Figure 2E:
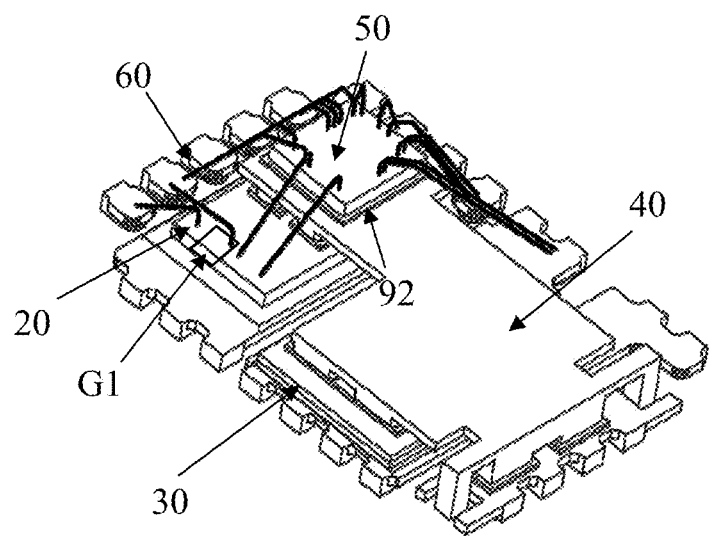

As shown in FIG. 2E, the IC chip 50 is attached on the top surface of the metal clip 40 through the non-conductive adhesive 92, as such the IC chip 50, the metal clip 40, the HS chip 20 and the LS chip 30 form a stacked multi-layer structure. In addition, the IC chip is electrically isolated from the electrodes of the HS chip 50 and the LS chip 30 through non-conductive adhesive 92.

In the example structure as shown in FIG. 1A, the IC chip 50 is located on the high-side connecting part 41 of the metal clip 40. However, the IC chip 50 can be located on other positions of the top surface of the metal clip 40 (not shown). The plurality of electrodes on the IC chip 50 is electrically connected with the corresponding pins 14 surrounding the lead frame 10 or the corresponding electrodes of HS and LS chips through the bonding wires 60 respectively.

Figure 2F:
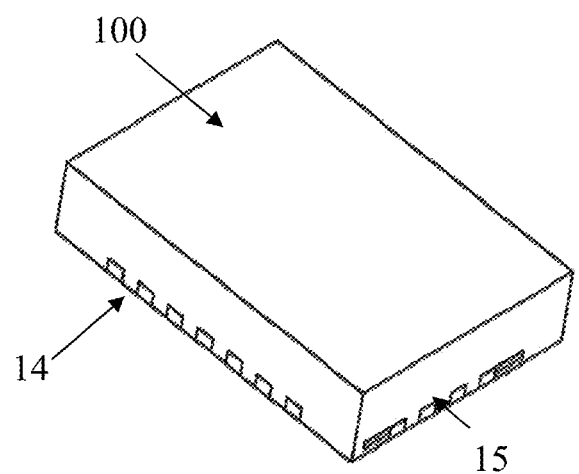

The package structure of the present invention further comprises a plastic package body 100 as shown in FIG. 2F. The IC chip 50, the metal clip 40, the HS chip 20 and the LS chip 30 and the bonding wires 60 are encapsulated inside the plastic package body 100 to form a device, while the part of pins 14 connecting with the external device is exposed from the plastic package body 100. Furthermore, the bottom surfaces of the first die paddle 11 and the second die paddle (such as the first part 12) of the lead frame 10 are also exposed from the plastic package body 100 for connecting with a circuit board or for improving the heat dissipation.

A packaging method for forming a package device as described above is shown in FIG. 2A-FIG. 2G. Firstly, as shown in FIG. 2A, a lead frame 10 is provided, which includes a first die paddle 11, a second die paddle separated from the first die paddle and including a first part 12 and a second part 13, a plurality of pins 14, and an interconnecting pin 15. As shown in FIG. 2B, a HS chip 20 is attached on the first die paddle 11, thus the drain electrode D1 at the back surface of the HS chip 20 is electrically connected with the first die paddle 11.

As shown in FIG. 2C, a LS chip 30 is flipped and attached on the second die paddle, thus the source electrode S1 at the front surface of the LS chip 30 is electrically connected to the first part 12 of the second die paddle and the gate electrode G2 at the front surface of the LS chip 30 is electrically connected to the second part 13 of the second die paddle. As shown in FIG. 2D, a metal clip 40 including a high-side connecting part 41, a low-side connecting part 42 and a pin connecting part 43, is mounted on the HS and LS chips 20 and 30 with the high-side connecting part 41 attached on the top surface of the HS chip 20, the low-side connecting part 42 attached on the top surface of the LS chip 30, and the pin connecting part 43 connected with the interconnecting pin 15 of the lead frame 10 via the soldering or conductive adhesive 91, as such the source electrode S1 at the front surface of the HS chip 20, the drain electrode D2 at the back surface of the flipped LS chip 30 are electrically connected with the interconnecting pin 15.

Figure 2G:
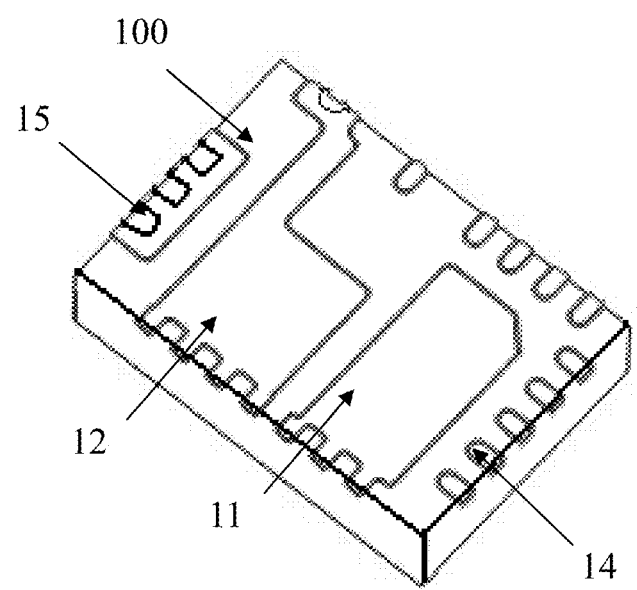

As shown in FIG. 2E, the IC chip 50 is attached on the top surface of the metal clip 40 through the non-conductive adhesive 92 forming a stacked multi-layer structure. In addition, the gate electrode G1 and source electrode S1 at the front surface of the HS chip 20 not being covered by the metal clip 40 are electrically connected to electrodes of the IC chip 50 and pins 14 of the lead frame 10 via bonding wires 60. As shown in FIG. 2F and FIG. 2G, which are top and bottom views of the final package device, the plastic package body 100 is deposited to encapsulate the stacked multi-layer structure including the IC chip 50, the metal clip 40, the HS chip 20 and the LS chip 30 and the bonding wires 60, where parts of the pins 14 and the back surface of the first die paddle 11 and the second die paddle are exposed from the plastic package body 100 for connecting to the external devices.

Figure 3:
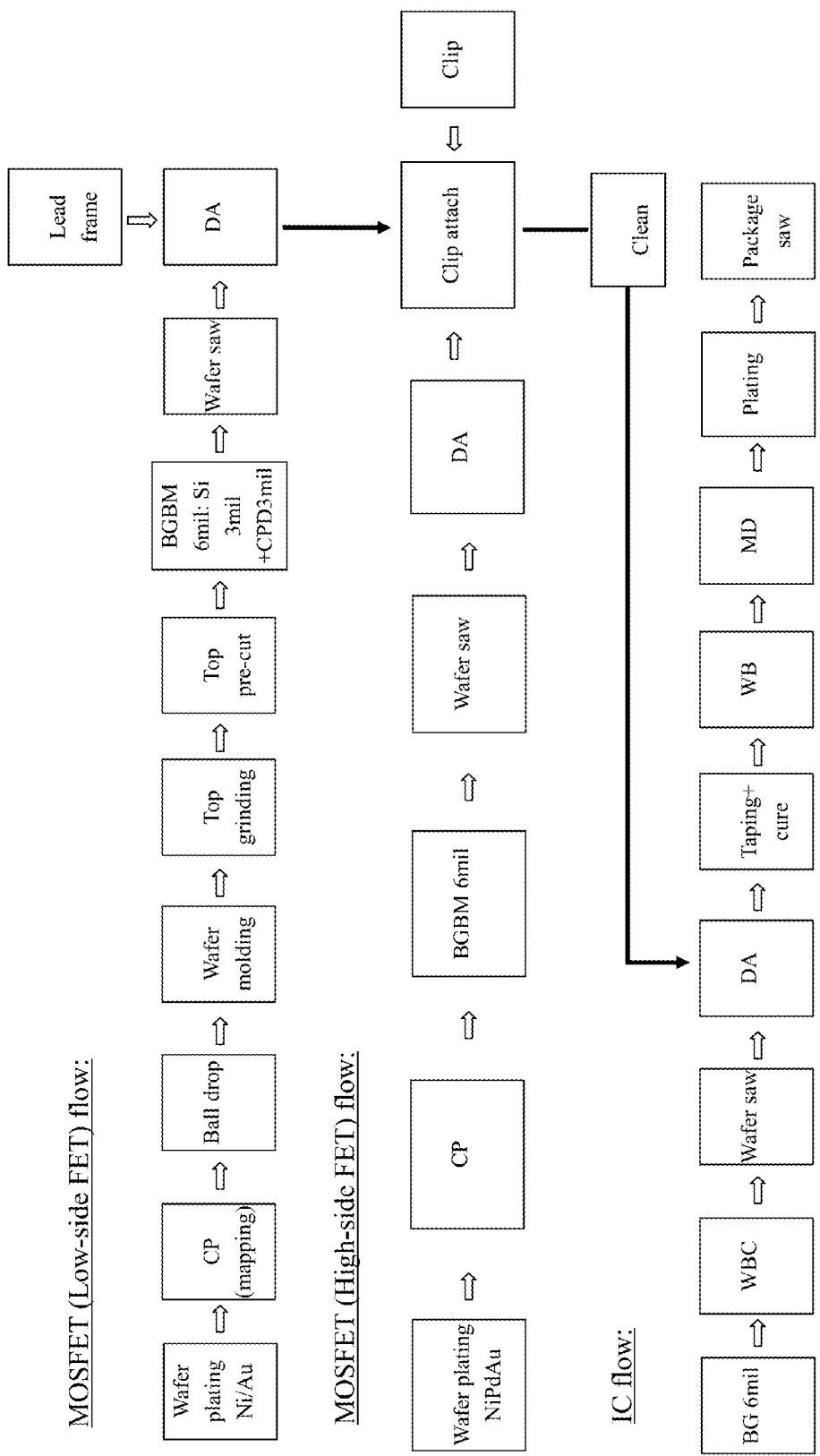
FIG. 3 illustrates a flow diagram of the chip packaging method according to the first embodiment of the present invention.

FIG. 3 is a flow chart showing the steps for forming a stacked multi-chip package structure at wafer level chip scale package according to an embodiment of the present invention. As shown in FIG. 3, the process flow for the LS chip 30 is as follows: a wafer including LS chips at the front surface is provided followed by forming plating, such as Ni/Au plating, on the surface of the LS chip 30. The LS chip is then mapped with the circuit pattern (CP), and then the conductive balls are deposited on the corresponding positions at the front surface of each LS chip to form corresponding electrodes. A plastic package body is deposited to encapsulate the front surface of the wafer covering the LS ships and the wafer is ground at the front surface to expose the top of the conductive balls from the top surface of the package body. For example, the exposed top surface of the conductive balls is co-planar with the top surface of the package body. The wafer is pre-cut at the front surface to form scribe lines, each of which locates between two adjacent LS chips. The wafer is then ground from the back surface to a predetermined thickness followed by forming a metal layer on the back surface of the grounded wafer (back grinding and back metalizing BGBM) to form corresponding electrodes; for example, the total thickness of the device structure is about 6 mil, in which the thickness of the ground wafer and the back metal layer is about 3 mil and the thickness of the grounded package body is about 3 mil. And then, individual LS chips 30 are singulated, and each LS chip is flipped over and attached on the second die paddle with the back surface facing upward (die attach DA).

As shown in FIG. 3, the process flow for the HS chip 20 is as followed: a wafer including HS chips at the front surface is provided followed by forming plating on the surface of the HS chip 20, such as the Ni/Pd/Au plating. The HS chip is then mapped with the circuit pattern (CP). The wafer is then grounded from the back surface to a predetermined thickness followed by forming a back metal layer at the back surface of the grounded wafer, for example, the thickness of the wafer and the back metal layer is about 6 mil. Individual HS chips 20 are singulated and attached on the first die paddle 11 with the front surface facing upward. At this stage, a metal clip 40 is provided and is attached on the HS and LS chips 20 and 30 as described above in FIG. 2D.

Furthermore, as shown in FIG. 3, the process flow for the IC chip 50 is as follows: a wafer including IC chips at the front surface is provided followed by grinding the back surface of the wafer to a predetermined thickness (back grinding BG), for example as 6 mil, and coating the back surface of the grounded wafer with a non-conductive adhesive 92 (wafer back coating WBC). Then, individual IC chips 50 are singulated and attached on the top surface of the cleaned metal clip 40 that is already attached on the HS and LS chips as described above.

The stacked multi-layer structure including the IC chip 50, the metal clip 40, the HS chip 20 and the LS chip 30 is attached on an adhesive tape for curing. Bonding wires 60 is formed for electrically connecting the electrodes of the corresponding chips and the pin 14 (wire bonding WB) followed by forming the plastic package body 100 to encapsulate the IC chip 50, the metal clip 40, the HS chip 20 and the LS chip 30 and the bonding wires 60 with parts of the pins 14 and the bottom surfaces of the first and second die paddles exposed from the plastic package body 100, then a plating is formed on the exposed positions of the pins and first and second die paddles. Finally, individual package devices are separated for example by sawing or punching and the likes.

Embodiment 2

Figure 4A:
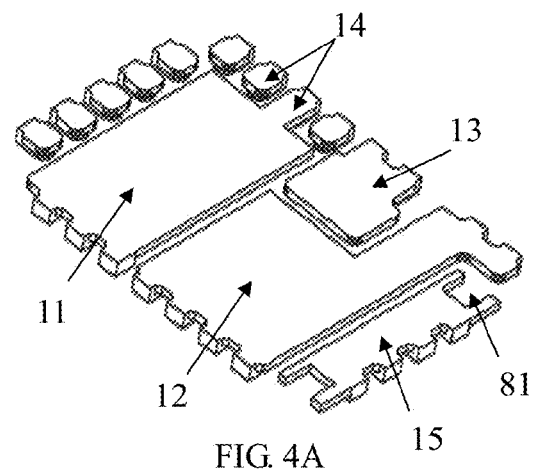
FIG. 4A-FIG. 4G are structural schematic diagrams illustrating corresponding steps of the chip packaging method according to a second embodiment of the present invention.
Figure 4B:
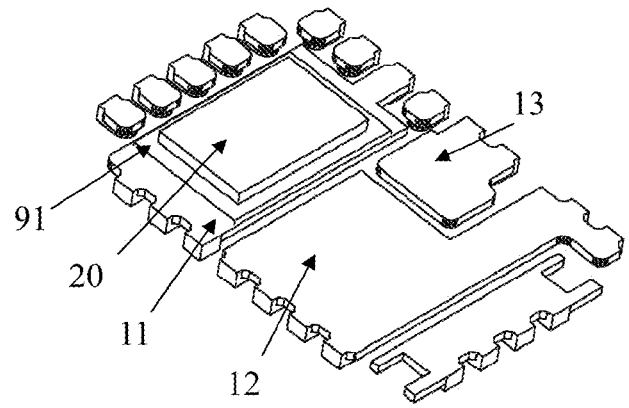
Figure 4C:
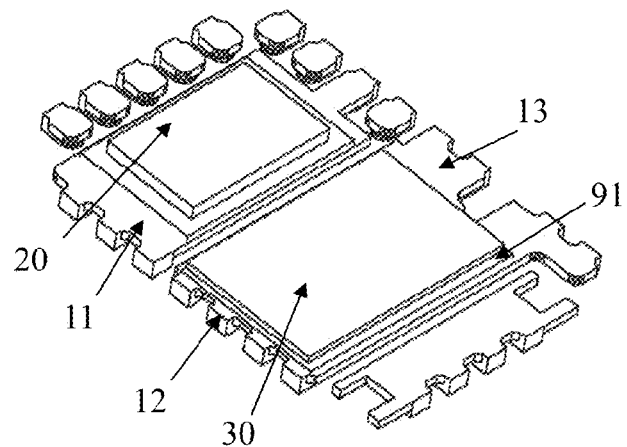
Figure 4D:
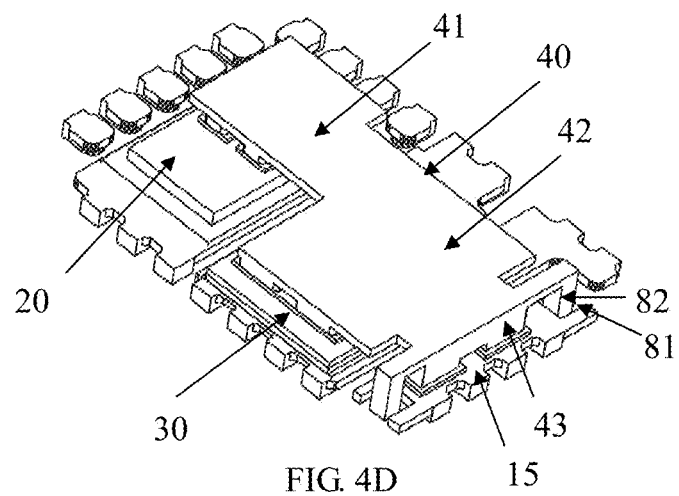
Figure 4E:
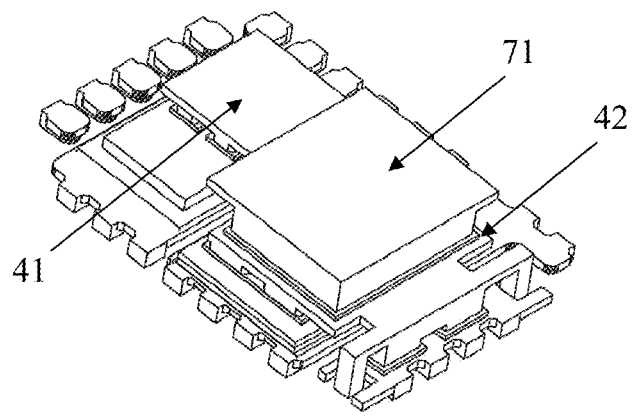
Figure 4F:
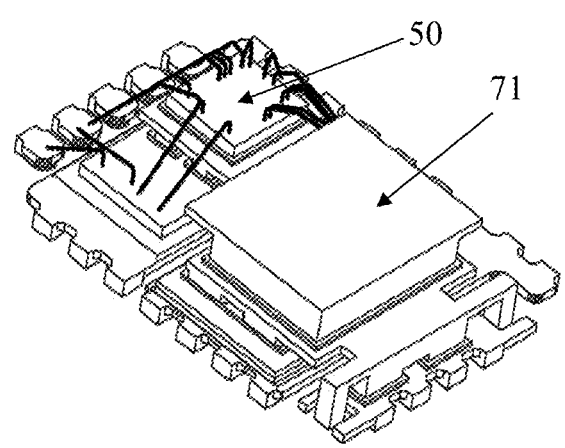
Figure 4G:
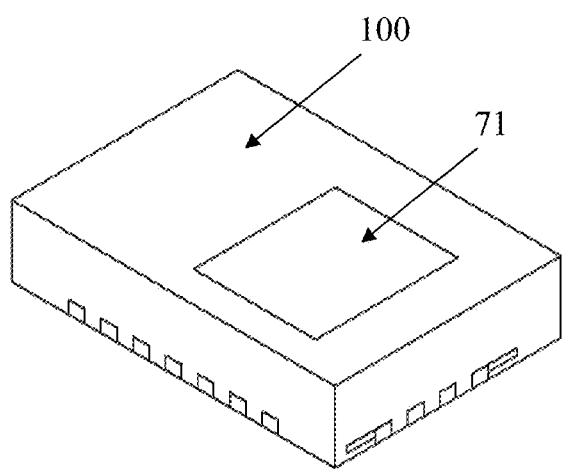
Figure 5:
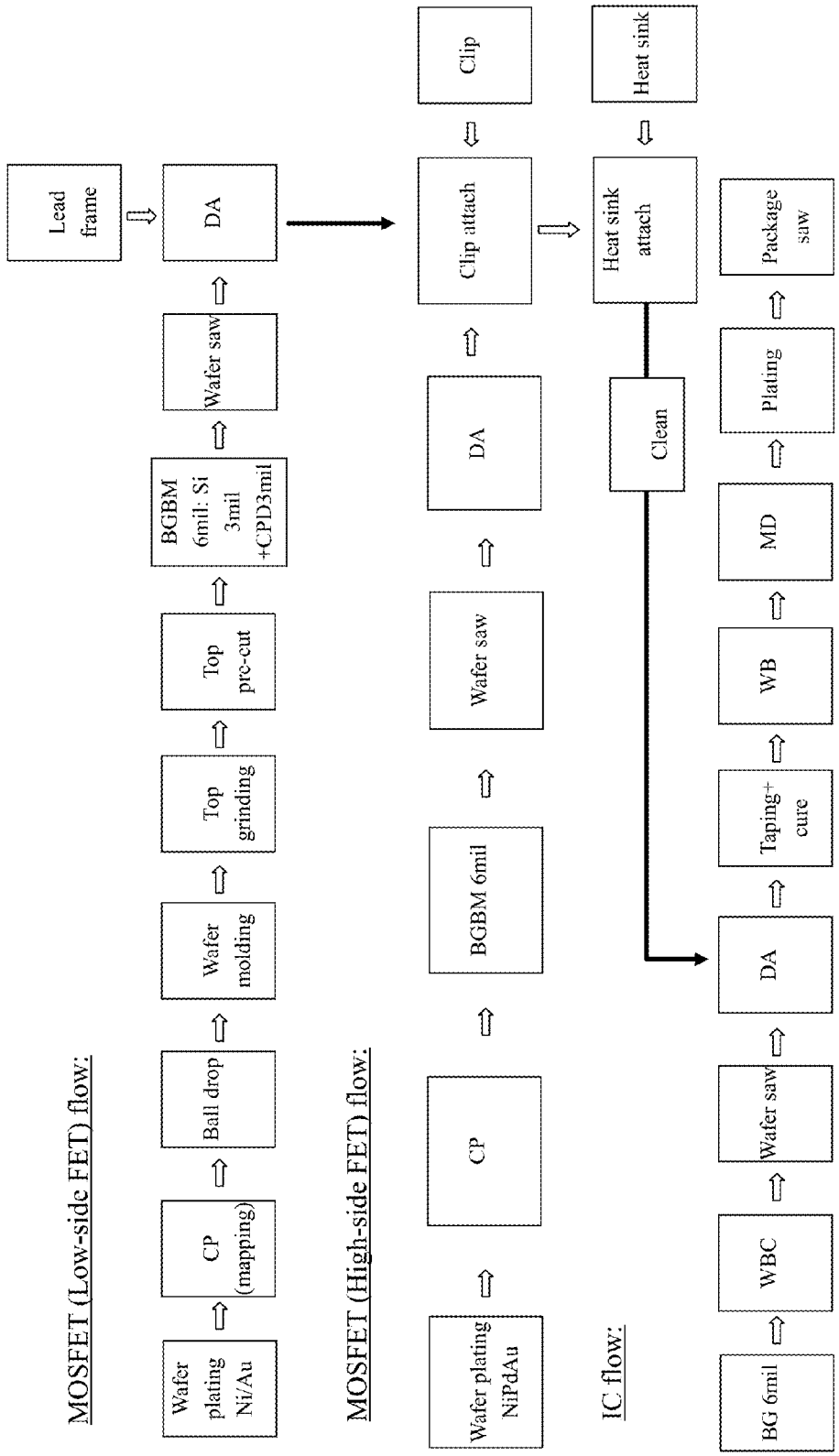
FIG. 5 illustrates a flow diagram of the chip packaging method according to the second embodiment of the present invention.

FIG. 4A-FIG. 4G are schematic diagrams showing the steps of a method for forming a stacked multi-chip package device according to an alternative embodiment and FIG. 5 is a flow diagram of the packaging method of FIGS. 4A-4G. FIG. 4A is a schematic diagram of a lead frame 10 that includes a first die paddle 11 and a second die paddle 12. As shown in FIG. 4B, the HS chip 20 is attached on the first die paddle 11, where the drain electrode D1 at the back surface is electrically connected to the first die paddle 11. The second die paddle includes the first part 12 and the second part 13, and a LS chip 30 is flipped and attached on the first part 12 and the second part 13 with the source electrode S2 and the gate electrode G2 at the front surface of the flipped LS chip 30 electrically connected with the first part 12 and the second part 13 of the second die paddle respectively as shown in FIG. 4C. As shown in FIG. 4D, a metal clip 40 is attached on the HS chip 20 and the LS chip 30, so that the high-side connecting part 41 of the metal clip 40 is electrically connected with the source electrode S1 at the front surface of the HS chip 20, while the low-side connecting part 42 of the metal clip 40 is electrically connected with the drain electrode D2 at the back surface of the flipped LS chip 30, and thus the source electrode S1 and the drain electrode D2 are further electrically connected with the interconnecting pin 15 of the lead frame 10 through the metal clip 40.

As shown in FIG. 4F, different from the embodiment 1, the IC chip 50 and a heat sink 71 are attached on the metal clip, for example, the heat sink 71 can be made of a copper plate with excellent thermal conductivity or similar material. In a preferred embodiment, the heat sink 71 is attached on the top surface of the low-side connecting part 42 of the metal clip 40 to improve the heat dissipation, while the IC chip 50 is electrically isolated and attached on the top surface of the high-side connecting part 41 of the metal clip 40. Thus, the stacked multi-layer structure includes the IC chip 50, the heat sink 71, the metal clip 40, the HS chip 20 and the LS chip 30. The thickness of the heat sink 71 is designed to be equivalent with the height of the bonding wire 60 connecting between the IC chip 50 and the HS chip 20 or the pin 14. The stacked multi-layer structure is packaged in the plastic package body 100, while the outside part of the pins 14, the bottom surface of the first die paddle 11 and the second die paddle are exposed from the bottom of the plastic package body 100, and the top surface of the heat sink 71 is also exposed outside the top surface of the plastic package body 100 to improve heat dissipation as shown in FIG. 4G. The top surface of the heat sink is preferably higher than the bonding wires 60. In an embodiment, the exposed top surface of the heat sink 71 only covers the second semiconductor chip 30. In another embodiment, the cross area of top surface of the heat sink 71 is larger than a cross area of the second semiconductor chip 30 and the top surface of the heat sink 71 are safely positioned above the bonding wires 60 (not physically and electrically connected with the bonding wires), where the exposed top surface of the heat sink substantially covers the top surface of the stacked multi-chip packaging structure (not shown).

FIG. 5 is a flow chart showing the steps for forming a stacked multi-chip package structure at wafer level chip scale package of FIGS. 4A-4G, which is similar to that of FIG. 3 in the embodiment 1, excepting that: the heat sink 71 is provided and is attached on the top surface of the metal clip 40 after the metal clip 40 is attached on the HS chip 20 and the LS chip 30 and before the metal clip 40 is cleaned and the IC chip 50 is attached on the metal clip 40.

Embodiment 3

Figure 6A:
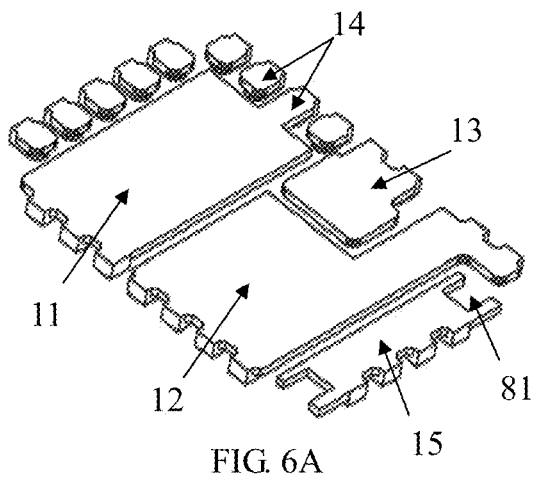
FIG. 6A-FIG. 6H are structural schematic diagrams illustrating corresponding steps of the chip packaging method according to a third embodiment of the present invention.
Figure 6B:
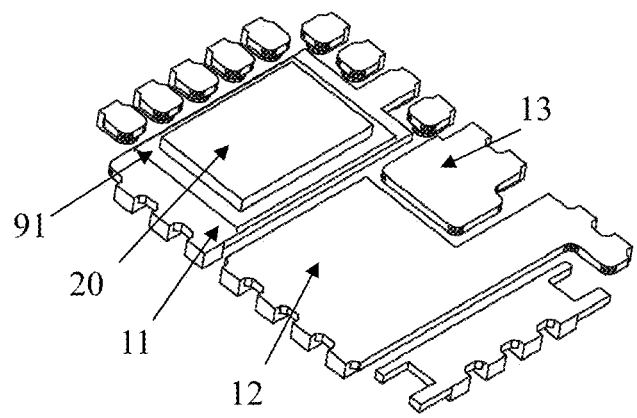
Figure 6C:
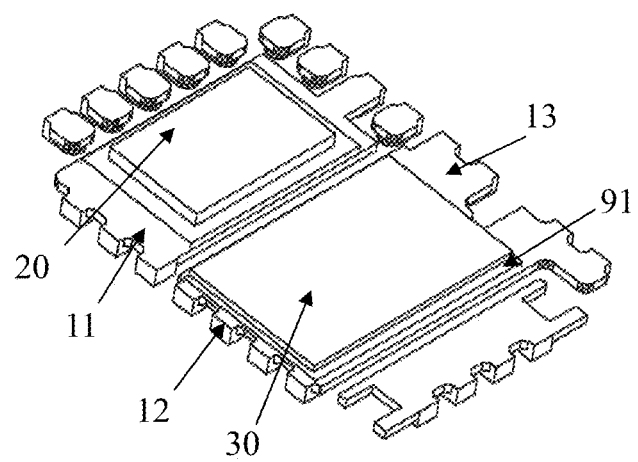
Figure 6D:
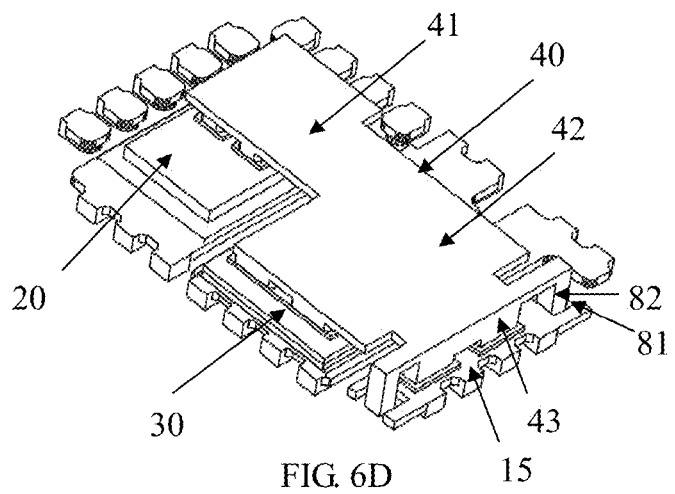
Figure 6E:
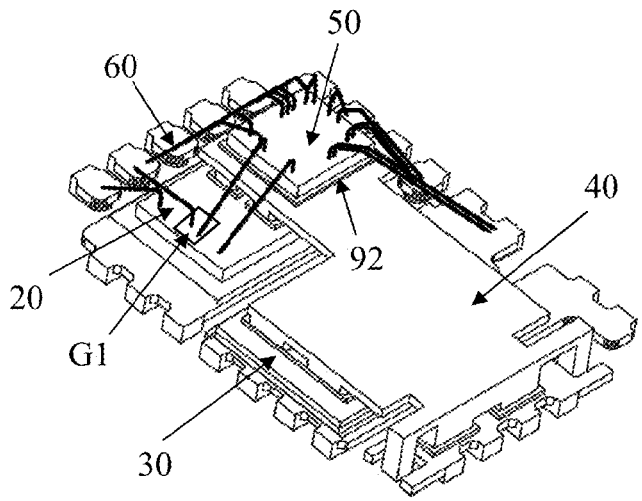
Figure 6F:
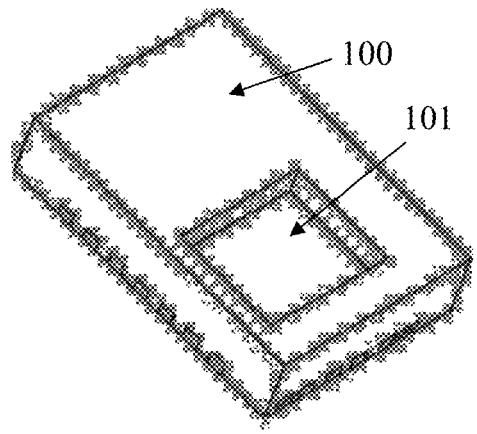
Figure 6G:
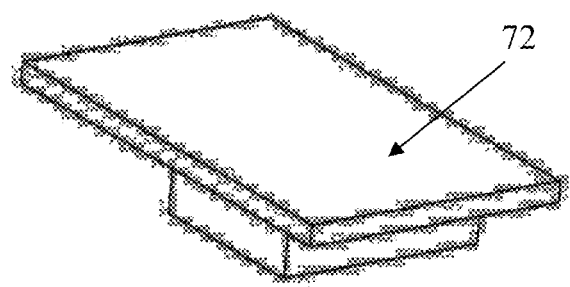
Figure 6H:
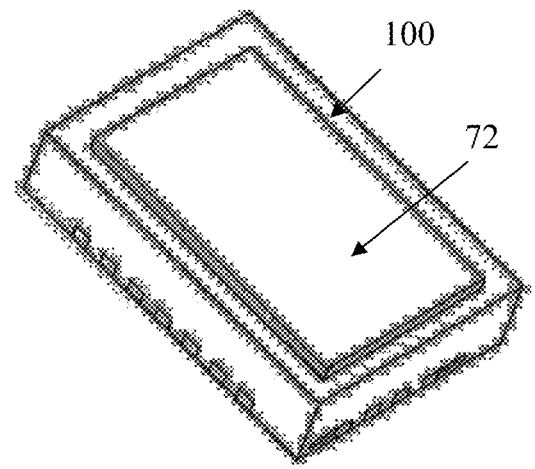
Figure 7:
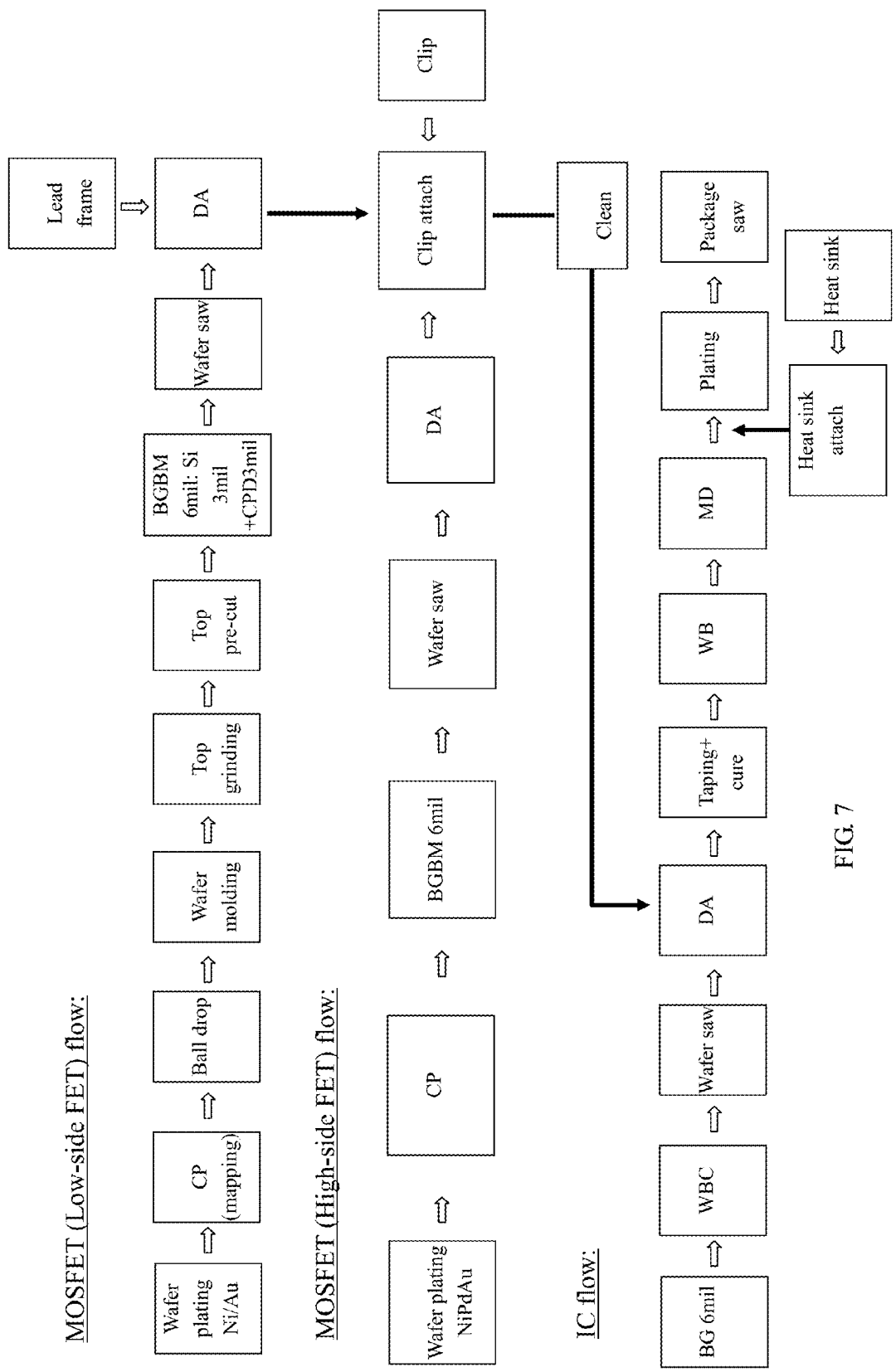
FIG. 7 illustrates a flow diagram of the chip packaging method according to the third embodiment of the present invention.

FIG. 6A-FIG. 6H are schematic diagrams showing the steps of a method for forming a stacked multi-chip package device according to an alternative embodiment and FIG. 7 is a flow diagram of the packaging method of FIG. 6A-FIG. 6H. As shown in FIG. 6A, the lead frame 10 includes the first die paddle 11 and a second die paddle that includes a first part 12 and a second part 13. As shown in FIG. 6B, a HS chip 20 is attached with the drain D1 at the back surface being electrically connected on the first die paddle 11. As shown in FIG. 6C, a LS chip 30 is flipped and attached with the source S2 and the gate G2 at the front surface being electrically connected on the second die paddle. As shown in FIG. 6D, a metal clip 40, including a high-side connecting part 41, a low-side connecting part 42 and a pin connecting part 43, is mounted on the HS chip 20 and the LS chip 30, so that the high-side connecting part 41 is electrically connected with the source S1 at the front surface of the HS chip 20, while the low-side connecting part 42 is electrically connected with the drain D2 at the back surface of the flipped LS chip 30, and thus the source S1 of the HS chip 20 and the drain D2 of the LS chip 30 are further electrically connected with the interconnecting pin 15 of the lead frame 10 through the pin connecting part 43.

As shown in FIG. 6E, the IC chip 50 is electrically isolated and attached on the high-side connecting part 41 of the metal clip 40, and then the bonding wires 60 are formed for electrically connecting between the IC chip 50, the HS chip 20 and the pin 14.

As shown in FIG. 6F, the stacked multi-layer structure of the IC chip 50, the metal clip 40, the HS chip 20 and the LS chip 30 is encapsulated by the plastic package body 100 with the bottom surface of the first and second die paddles are exposed from the plastic package body 100 similar as that shown in embodiment 1, while a notch 101 is formed on the top surface of the plastic package body 100, so that part of the top surface of the low-side connecting part 42 on the metal clip 40 is exposed from the notch 101. FIG. 6G shows a heat sink 72 including a conductive plate, such as a copper plate with excellent heat conductivity or a similar material, and a inserting part protruding downward from the bottom of the heat sink 72 for inserting into the notch 101 of the plastic package body 100, where the inserting part has a designed thickness so that the inserting part is able to contact the metal clip 40. As shown in FIG. 6H, the heat sink 72 is inserted into the notch 101 on the top surface of the plastic package body 100, where the heat sink area is smaller than that of the top surface of the plastic package body 100 for improving the heat dissipation.

FIG. 7 is a flow chart showing the steps for forming a stacked multi-chip package structure at wafer level chip scale package of FIGS. 6A-6G, which is similar to that of FIG. 3 in the embodiment 1, excepting that a heat sink 72 is provided and the inserting part of the heat sink 72 is inserted into the notch 101 at the top surface of the plastic package body 100 after the plastic package body 100 with the notch 101 is formed to encapsulate the stacked multi-layer structure.

Embodiment 4

Figure 8A:
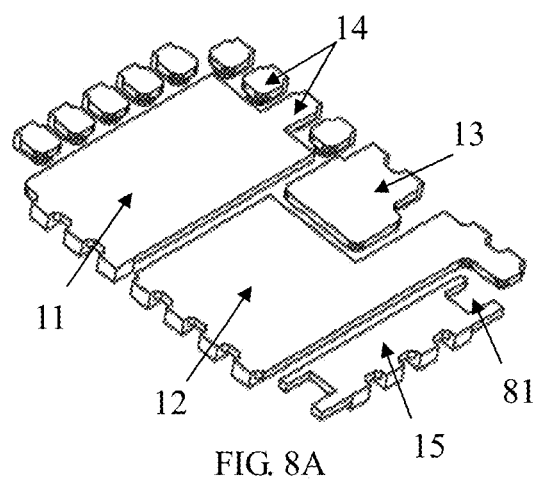
FIG. 8A-FIG. 8F are structural schematic diagrams illustrating corresponding steps of the chip packaging method according to a fourth embodiment of the present invention.
Figure 8B:
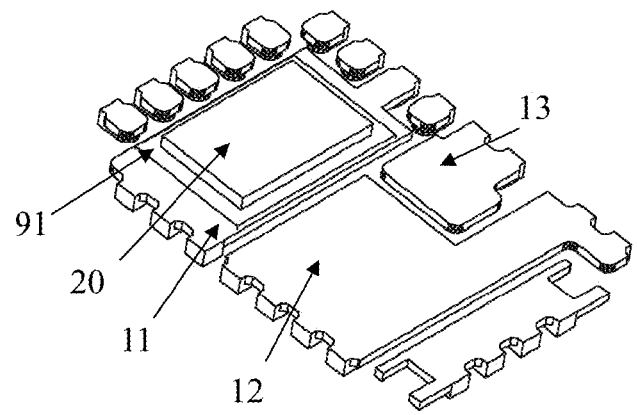
Figure 8C:
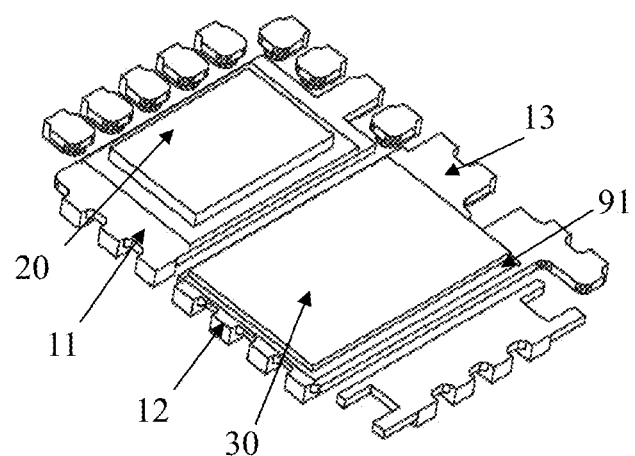
Figure 8D:
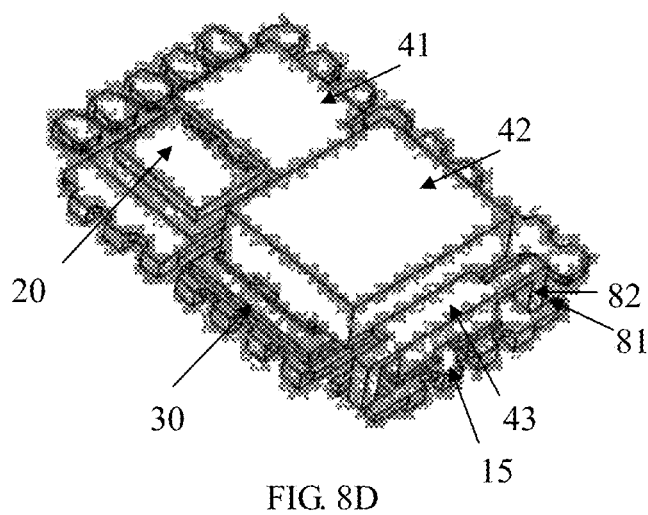
Figure 8E:
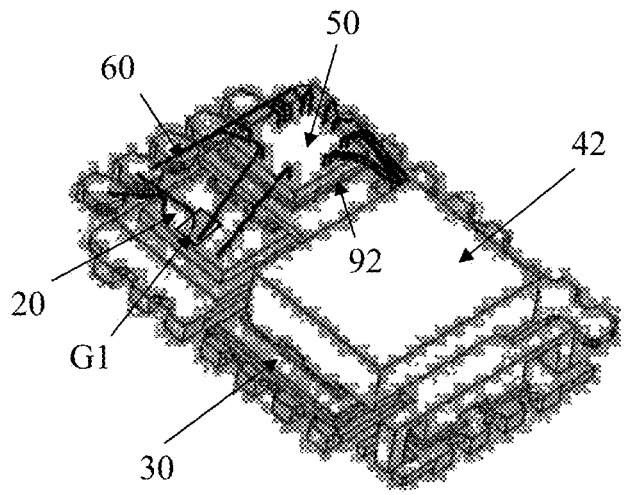
Figure 8F:
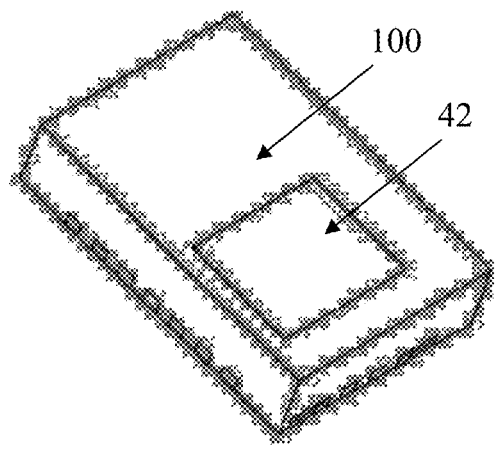
Figure 9:
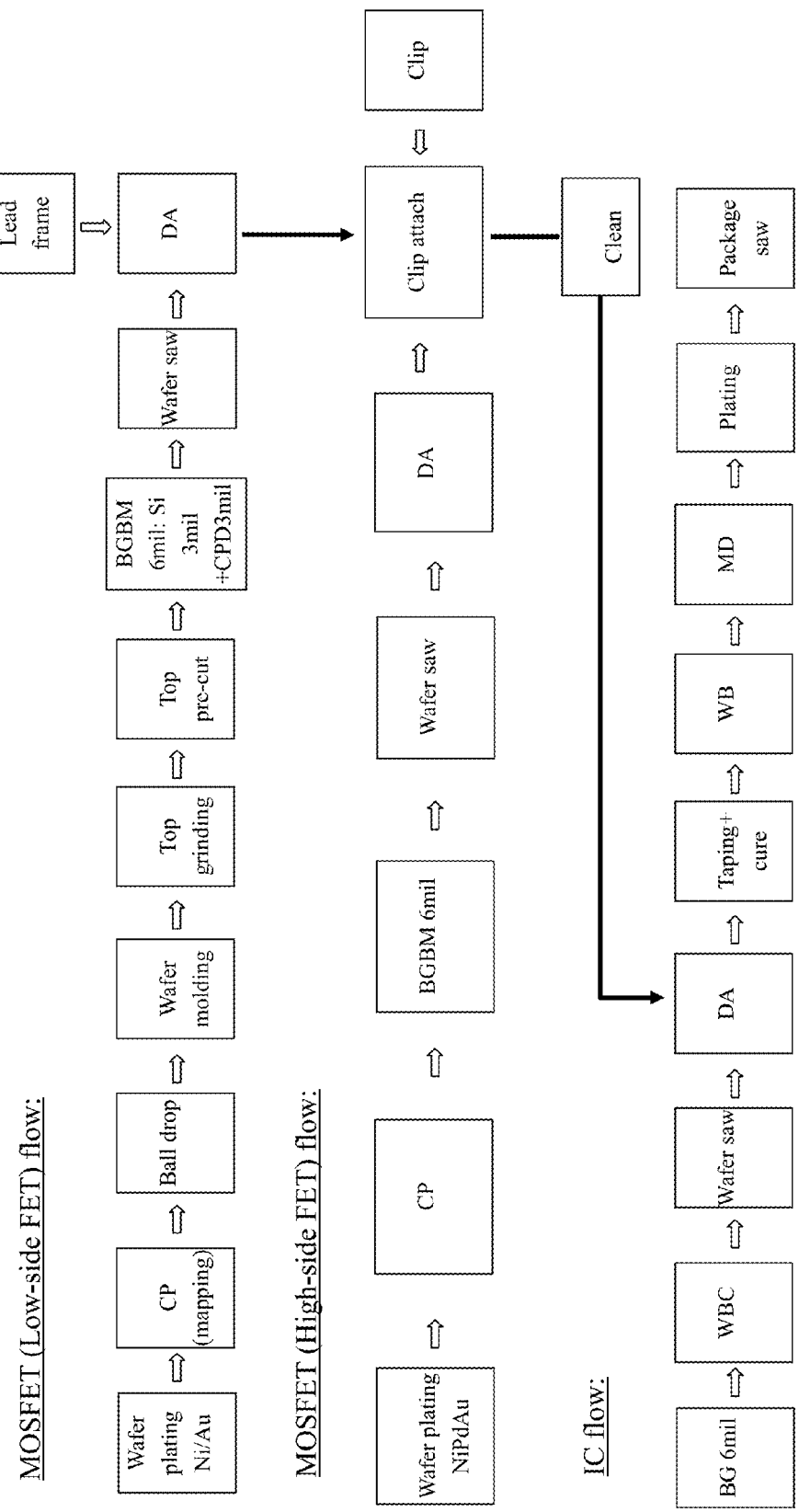
FIG. 9 illustrates a flow diagram of the chip packaging method according to the fourth embodiment of the present invention.

FIG. 8A-FIG. 8F are schematic diagrams showing the steps of a method for forming a stacked multi-chip package device according to an alternative embodiment and FIG. 9 is a flow diagram of the packaging method of FIG. 8A-FIG. 8F. FIG. 8A shows a lead frame 10 including the first die paddle 11 and a second die paddle that includes a first part 12 and the second part 13. As shown in FIG. 8B, a HS chip 20 is attached with the drain D1 at the back surface is electrically connected on the first die paddle 11. As shown in FIG. 8C, a LS chip 30 is flipped and attached on the second die paddle with the source S2 and the gate G2 at the front surface are electrically connected on the first part 12 and the second part 13 of the second die paddle respectively. As shown in FIG. 8D, a metal clip 40 is attached on the HS chip 20 and the LS chip 30, where the high-side connecting part 41 of the metal clip 40 is electrically connected with the source S1 at the front surface of the HS chip 20, while the low-side connecting part 42 of the metal clip 40 is electrically connected with the drain D2 at the back surface of the flipped LS chip 30, and thus the source S1 and the drain D2 are further electrically connected with the interconnecting pin 15 of the lead frame 10 through the pin connecting part 43 of the metal clip 40.

In this embodiment, the structure of the metal clip 40 is different from that described above, where the high-side connecting part 41 (and the pin connecting part 43) is thinner than the low-side connecting part 42 as shown in FIG. 8D. However, the thickness of the low-side connecting part 42 is designed such that after the IC chip 50 is electrically isolated and attached on the high-side connecting part 41 of the connection plate 40 and the bonding wires 60 are formed between the IC chip 50 and the HS chip 20 or the pin 14, the top surface of the low-side connecting part 42 is same high as the bonding wires 60 as shown in FIG. 8E. Thus, the stacked multi-layer structure of the IC chip 50, the metal clip 40, the HS chip 20 and the LS chip 30 is encapsulated by the plastic package body 100, besides the exposed part at the bottom surface of the plastic package body 100 is same as described above, the top surface of the low-side connecting part 42 of the metal clip 40 is further exposed form the top surface of the plastic package body 100 to further improve the heat dissipation. The three parts of the metal clip 40 can be either formed in one piece or formed in separate pieces and then are connected together.

As shown in FIG. 9, in this embodiment, the processes of mounting and packaging the lead frame 10, the HS chip 20, the LS chip 30 and the IC chip 50 are basically similar as those in the embodiment 1 excepting that the top surface of the low-side connecting part 42 of the metal clip 40 is covered by a tape before forming the plastic package body 100, so that the low-side connecting part 42 is exposed from the top surface of the plastic package body 100 after the plastic package body 100 is deposited to encapsulate the stacked multi-chip structure as described above.

The present invention describes the packaging structure and the packaging method of stacking and connecting the plurality of chips through the metal clip 40. By way of example, but not limitation two MOSFET chips and the IC chip 50 have been selected to describe above. However, any other device structures, such as a high-voltage IGBT chip (Insulated Gate Bipolar Transistor), a high-voltage controller, or more than three chips being stacked on the device structure. The above detailed descriptions are provided to illustrate specific embodiments of the present invention and are not intended to be limiting. Numerous modifications and variations within the scope of the present invention are possible. The present invention is defined by the appended claims.

What is claimed is:

1. A method for forming a stacked multi-chip packaging structure, the method comprising the steps of:
   providing a lead frame comprising a first die paddle, a second die paddle and a plurality of pins separated from each other, wherein the second die paddle comprises a first part and a second part separated from each other;
   attaching a first semiconductor chip to the first die paddle with an electrode at a back surface of the first semiconductor chip being electrically connected to the first die paddle;
   flipping and attaching a second semiconductor chip to the second die paddle with an electrode at a front surface of the second semiconductor chip being electrically connected to the first part of the second die paddle and another electrode being electrically connected to the second part of the second die paddle;
   attaching a metal clip to the first semiconductor chip and the second semiconductor chip with a bottom surface of metal clip being electrically connected to electrodes arranged on a front surface of the first semiconductor chip and an electrode arranged on a back surface of the flipped second semiconductor chip;
   attaching a third semiconductor chip to a top surface of the metal clip with the third semiconductor chip being electrically isolated from the metal clip;
   forming bonding wires between the electrodes of different semiconductor chips or between the electrode of a semiconductor chip and a pin; and
   forming a plastic package body for encapsulating the third semiconductor chip, the metal clip, the first semiconductor chip and the second semiconductor chip and the lead frame which are stacked into a multi-layer structure in sequence, and then separating individual stacked multi-chip packaging structures by cutting through the plastic package body, wherein portions of the pin and portions of the back surface of the first die paddle and the second die paddle are exposed from the plastic package body for electrically connecting to an external device.

2. The method of claim 1 further comprising, before forming the plastic package body, attaching a heat sink to the top surface of the metal clip, wherein the heat sink thermally contacts the metal clip to improve heat dissipation through a top surface of the heat sink exposed from the plastic package body.

3. The method of claim 1 further comprising forming a notch on a top surface of the formed plastic package body; inserting a bottom part of a heat sink into the notch to thermally connect the heat sink with the top surface of the metal clip to improve heat dissipation through a top surface of the heat sink exposed from the top surface of the plastic package body.

4. The method of claim 1, wherein the metal clip comprises a high-side connecting part attached to the first semiconductor chip and a low-side connecting part attached to the second semiconductor chip, and wherein the high-side connecting part and the low-side connecting part of the metal clip have the same or different thickness;
   when a thickness of the high-side connecting part and the low-side connecting part is different, the third semiconductor chip is attached to a thinner part of the high-side connecting part or the low-side connecting part of the metal clip, and a thicker part of the high-side connecting part or the low-side connecting part is exposed from the plastic package body to improve heat dissipation.

5. The method of claim 1, wherein a conductive adhesive is deposited between the first semiconductor chip and the first die paddle, between the second semiconductor chip and the second die paddle, and between the metal clip and the first semiconductor chip and the second semiconductor chip, and wherein a non-conductive adhesive is deposited between the third semiconductor chip and the metal clip.

6. The method of claim 1, a sum of thicknesses of the metal clip and the first semiconductor chip and a sum of thicknesses of the metal clip and the second semiconductor chip are defined by a dimple formed in the metal clip, which further prevents the metal clip from tilting.

7. The method of claim 6, wherein a first process for stacking the first semiconductor chip in the stacked multi-layer packaging structure comprises the steps of:
   forming plating on a front surface of a silicon wafer comprising a plurality of first semiconductor chips;
   performing semiconductor chip test;
   grinding at a back surface of the silicon wafer to a predetermined thickness and depositing a metal layer on a back surface of the ground silicon wafer so as to form a back electrode;
   cutting the silicon wafer to separate individual first semiconductor chips; and
   attaching the back surface of the first semiconductor chip to the first die paddle.

8. The method of claim 7, wherein a second process for stacking the second semiconductor chip in the stacked multi-layer packaging structure comprises the steps of:
   forming plating on a front surface of another silicon wafer comprising a plurality of second semiconductor chips;
   performing semiconductor chip test and mapping a circuitous pattern;

depositing a conductive ball on predetermined position of a front surface of the other silicon wafer to form a corresponding electrode;

forming a package body at chip scale package level to encapsulate the second semiconductor chip and the conductive ball;

grinding at the front surface of the second semiconductor chip to expose a top of the conductive ball from a top surface of the package body;

pre-cutting the front surface of the other silicon wafer to from a scribe line located between two adjacent second semiconductor chips;

grinding at a back surface of the other silicon wafer to a predetermined thickness and depositing a metal layer on a ground back surface of the other silicon wafer to form a corresponding back electrode;

cutting the other silicon wafer along the scribe line to separate individual second semiconductor chips; and flipping and attaching the second semiconductor chip to the second die paddle.

9. The method of claim 8, wherein a third process for stacking the third semiconductor chip in the stacked multi-layer packaging structure comprises the steps of:

grinding at a back surface of a wafer comprising a plurality of third semiconductor chips on a front surface of the wafer, wherein the wafer in ground to a predetermined thickness;

coating a non-conductive adhesive on a back surface of the third semiconductor chip;

cutting the wafer to separate individual third semiconductor chips;

attaching the third semiconductor chip to the top surface of the metal clip after the metal clip is attached to the first semiconductor chip and the second semiconductor chip;

attaching the stacked multi-layer structure including the third semiconductor chip, the metal clip, the first semiconductor chip and the second semiconductor chip to an adhesive tape for curing;

forming bonding wires between corresponding electrodes of different semiconductor chips and between the electrode of a semiconductor chip and the pin respectively;

forming the plastic package body for encapsulating the stacked multi-layer structure and the bonding wires, wherein the pin and the bottom surfaces of the first die paddle and the second die paddle are exposed from the plastic package body;

forming plating in exposed portions of the pin and the bottom surfaces of the first die paddle and the second die paddle; and cutting the lead frame to separate individual package devices.

* * * * *